(12) United States Patent
Northrup et al.

(10) Patent No.: US 9,419,194 B2
(45) Date of Patent: Aug. 16, 2016

(54) TRANSPARENT ELECTRON BLOCKING HOLE TRANSPORTING LAYER

(71) Applicant: Palo Alto Research Center Incorporated, Palo Alto, CA (US)

(72) Inventors: John E. Northrup, Palo Alto, CA (US); Christopher L. Chua, San Jose, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 29 days.

(21) Appl. No.: 13/965,985

(22) Filed: Aug. 13, 2013

(65) Prior Publication Data
US 2015/0048397 A1 Feb. 19, 2015

(51) Int. Cl.
| H01L 33/00 | (2010.01) |
| H01L 33/62 | (2010.01) |
| H01L 33/06 | (2010.01) |
| H01L 33/20 | (2010.01) |
| H01L 33/32 | (2010.01) |
| H01L 33/38 | (2010.01) |
| H01L 33/40 | (2010.01) |

(52) U.S. Cl.
CPC ............... *H01L 33/62* (2013.01); *H01L 33/06* (2013.01); *H01L 33/387* (2013.01); *H01L 33/405* (2013.01); *H01L 33/20* (2013.01); *H01L 33/32* (2013.01); *H01L 33/382* (2013.01); *H01L 33/40* (2013.01)

(58) Field of Classification Search
None
See application file for complete search history.

(56) References Cited

U.S. PATENT DOCUMENTS

| 6,379,985 B1 | 4/2002 | Cervantes et al. |
| 6,433,355 B1 | 8/2002 | Riess et al. |
| 6,916,676 B2 | 7/2005 | Sano et al. |
| 6,919,585 B2 | 7/2005 | Liu |
| 6,921,928 B2 | 7/2005 | Sonobe |
| 8,168,986 B2 | 5/2012 | Nishinaka et al. |
| 8,222,669 B2 | 7/2012 | Khan et al. |

(Continued)

FOREIGN PATENT DOCUMENTS

| WO | WO2006074916 | 7/2006 |
| WO | WO2007005984 | 1/2007 |
| WO | WO2012067687 | 5/2012 |

OTHER PUBLICATIONS

Carnevale et al., "Polarization-Induced pn Diodes in Wide-Band-Gap Nanowires with Ultraviolet Electroluminescence", American Chemical Society, Jan. 23, 2012, pp. 915-920.

(Continued)

*Primary Examiner* — Daniel Whalen
(74) *Attorney, Agent, or Firm* — Hollingsworth Davis, LLC

(57) ABSTRACT

A light emitting diode includes an active region configured to emit light, a composite electrical contact layer, and a transparent electron blocking hole transport layer (TEBHTL). The composite electrical contact layer includes two materials. At least one of the two materials is a metal configured to reflect a portion of the emitted light. The TEBHTL is arranged between the composite electrical contact layer and the active region. The TEBHTL has a thickness that extends at least a majority of a distance between the active region and the composite electrical contact layer. The TEBHTL has a band-gap greater than a band-gap of light emitting portions of the active region. The band-gap of the TEBHTL decreases as a function of distance from the active region to the composite electrical contact layer over a majority of the thickness of the TEBHTL.

15 Claims, 16 Drawing Sheets

(56) References Cited

U.S. PATENT DOCUMENTS

| | | |
|---|---|---|
| 8,421,107 B2 | 4/2013 | Shinohara et al. |
| 2007/0181869 A1* | 8/2007 | Gaska et al. .................. 257/14 |
| 2011/0235665 A1 | 9/2011 | Simon et al. |
| 2012/0119189 A1 | 5/2012 | Gaska et al. |
| 2013/0099141 A1 | 4/2013 | Chua |
| 2013/0193471 A1* | 8/2013 | Toyota et al. .................. 257/98 |

OTHER PUBLICATIONS

Nishida et al., "Short Period Alloy Superlattice for Transparent Conductive Layer of UV-emitter", Proc. Int. Workshop on Nitride Semiconductors Series 1, Mar. 26, 2002, pp. 872-874.

Verma et al., "N-Polar III-Nitride Quantum Well Light-Emitting Diodes with Polarization-Induced Doping", Applied Physics Letters 99, Oct. 25, 2011, pp. 171104-1-171104-3.

\* cited by examiner

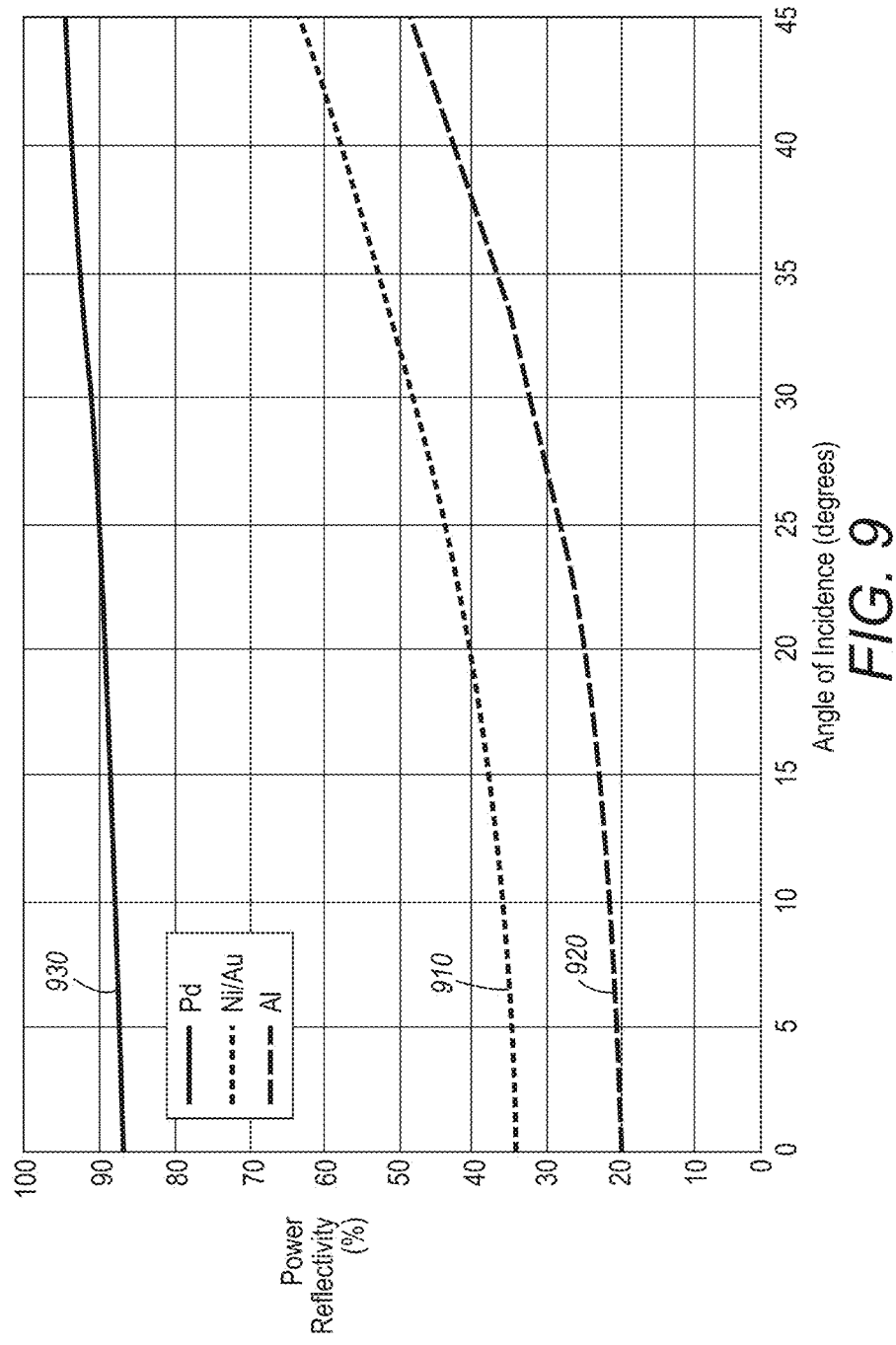

TRANSPARENT ELECTRON BLOCKING HOLE TRANSPORTING LAYER

STATEMENT REGARDING FEDERALLY SPONSORED RESEARCH AND DEVELOPMENT

This invention was made with Government support under U.S. Army Agreement No. W911NF-10-02-0102 (3713) awarded by the U.S. Army Research Laboratory. The Government has certain rights in this invention.

TECHNICAL FIELD

This disclosure relates generally to light emitting device, as well as articles and systems that incorporate such devices, and methods pertaining to such devices.

BACKGROUND

Light emitting diodes can be produced based on larger bandgap semiconductor materials, such as III-nitride materials including AlN, GaN, AlGaN, InGaN, InAlN, InAlGaN, and others. However, doping these materials to achieve high hole concentration is difficult because the activation energy of dopants in these larger bandgap materials is relatively high. Additionally, high aluminum containing p-type doped III-nitride materials have poor hole transport properties. When homogeneous III-nitride materials are used on the p-side of a light emitting diode (LED), the device voltages increases to very high values as the aluminum molar fraction exceeds 30%. Consequently, most ultraviolet light-emitting diodes (UV LEDs) utilize low aluminum-containing materials on their p-side, despite the fact that such layers are optically absorbing at the emission wavelength. Such a strategy enables lower device operating voltages, but sacrifices emitted light to optical loss.

SUMMARY

Some embodiments involve a light emitting diode that includes an active region configured to emit light. A composite electrical contact layer of the light emitting diode includes at least two materials. At least one of the two materials is a metal configured to reflect a portion of the emitted light. The light emitting diode also includes a transparent electron blocking hole transporting layer (TEBHTL) arranged between the composite electrical contact layer and the active region. The TEBHTL has a thickness that extends at least a majority of a distance between the active region and the composite electrical contact layer. The TEBHTL has a band-gap greater than a band-gap of light emitting portions of the active region. The band-gap of the TEBHTL decreases as a function of distance from the active region to the composite electrical contact layer over a majority of the thickness of the TEBHTL.

Some embodiments of a light emitting diode include an active region configured to emit light, a composite electrical contact layer and a TEBHTL disposed between the active layer and the composite electrical contact layer. The composite electrical contact layer comprises at least two materials, at least one material arranged as a reflective metal sub-layer configured to reflect the emitted light. The TEBHTL is a transparent electron blocking contact layer having a thickness that extends at least a majority of a distance between the active region and the electrical contact layer. The band-gap of the TEBHTL is greater than a band-gap of light emitting portions of the active region. The band-gap of the TEBHTL decreases as a function of distance from the active region to the electrical contact layer over a majority of the thickness of the TEBHTL.

According to some embodiments, a light emitting diode includes an active region configured to emit light, an electrical contact layer, and a TEBHTL disposed between the active region and the electrical contact layer. The TEBHTL is a transparent electron blocking hole transporting layer having a thickness that extends at least a majority of a distance between the active region and the composite electrical contact layer. The TEBHTL has a band-gap greater than a band-gap of light emitting portions of the active region. The band-gap of the TEBHTL decreases as a function of distance from the active region to the composite electrical contact layer over a majority of the thickness of the TEBHTL.

BRIEF DESCRIPTION OF THE DRAWINGS

Throughout the specification reference is made to the appended drawings, where like reference numerals designate like elements, and wherein:

FIG. 9 shows graphs of reflectivity vs. angle of incidence for Pd, Ni/Au, and Al reflectors on GaN-free regions;

DESCRIPTION

Figure 1:
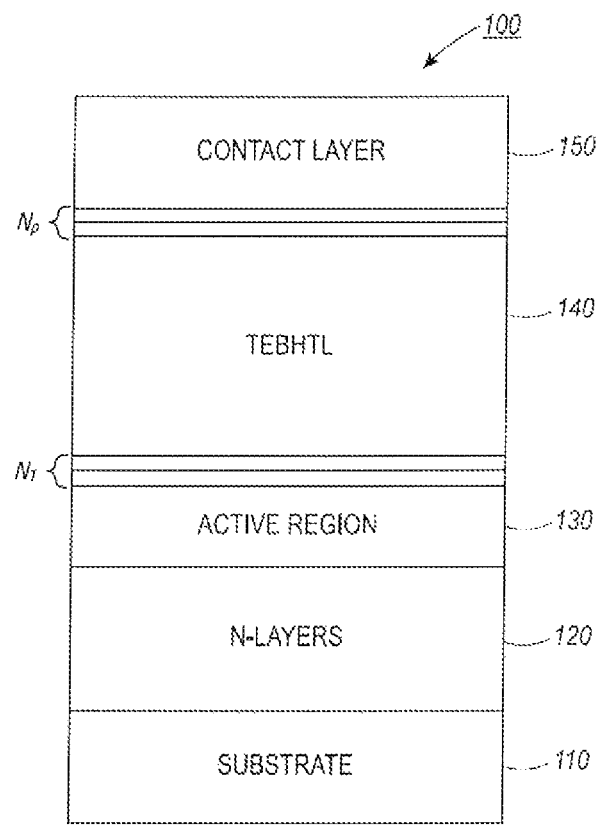
FIG. 1 is a cross section of a light emitting diode (LED) structure that includes a transparent graded electron blocking contact layer (TEBHTL) in accordance with some embodiments.

Approaches described in this disclosure relate to ultraviolet (UV) light emitting diodes (LEDs) incorporating a p-layer design that is both optically transparent and highly conductive. To achieve optical transparency, the design utilizes p-doped materials, e.g., III-nitride materials such as AlGaN or AlGaInN that have bandgaps higher than the bandgap of the light-emitting active region. High conductivity is achieved using a composition-graded design in a layer that serves as both an electron blocking layer and hole transporting layer, referred to herein as a transparent electron blocking hole transporting layer (TEBHTL). The composition grading in the TEBHTL produces a built-in polarization field that helps to ionize p-dopants to produce high hole concentration. The TEBHTL disclosed herein is effective at blocking electrons from overshooting the active region, and can achieve significant carrier injection efficiencies.

In some embodiments, the p-layer design includes an electrical contact layer disposed on the TEBHTL that comprises a thin, highly doped material, such as highly doped p-GaN. The electrical contact layer is thin enough to be substantially optically transparent even though GaN would be optically absorbing to the emitted light at greater thicknesses.

In some embodiments, the p-side electrical contact layer comprises a composite layer that includes at least two materials. At least one of the two materials is a metal configured to reflect a portion of the emitted light. The composite electrical contact on the p-side of the UV LED enhances light extraction from the device. In some embodiments, the composite electrical contact layer may include one or more sub-layers, such as a reflector layer, a transparent contact layer and/or a phase matching layer as discussed below.

The TEBHTL described herein employs polarization enhanced doping to increase the hole concentration in a graded transparent design that can provide both electron blocking and hole transport. Polarization is an intrinsic property of some crystals, and is related to the distribution of positive charge of the atomic nuclei and the negative charge of the electrons in the crystal. Polarization can be employed to increase or decrease the local concentration of mobile carriers present in semiconductors. This phenomenon is referred to as polarization enhanced doping and can be employed to improve the performance of some light emitting devices.

Polarization is present in compounds exhibiting the wurtzite structure and comprising atoms having significant differences in electronegativity. Examples of such materials include the broad class of III-nitride materials, which includes the binary compounds AlN, GaN, and InN, the ternary alloys AlGaN, InAlN, and InGaN, and the quaternary alloy AlGaInN. Polarization is also present in oxides such as ZnO and BeO. The polarization of an alloy depends on the composition of the alloy. The amount of polarization also depends on the amount of strain present in the material. The polarization that arises from strain is called the piezoelectric polarization, and the polarization that is present even in the absence of strain is called the spontaneous polarization. Strain affects the polarization because it affects the distribution of charge. A very thick freestanding film of AlN will exhibit no strain, and in such a state will exhibit spontaneous polarization only.

A layer of material A will be strained when it is grown on a thick substrate material S if the equilibrium lattice constant of A (in the plane of the interface with S) differs from that of S. In the absence of strain relieving defects the in-plane lattice constant of A is forced to be the same as that of S. In this case we say that A is pseudomorphic to S. For example, if a thin layer of AlGaN is grown on a thick substrate of AlN then the AlGaN will exhibit compressive strain, and the AlGaN layer will exhibit both spontaneous and piezoelectric polarization. The AlN substrate is not strained and will exhibit only the spontaneous polarization of bulk AlN. If a thin layer of AlGaN is grown on a thick substrate of GaN then the AlGaN will exhibit tensile strain. Thus the polarization in AlGaN will depend on whether it is grown on AlN or GaN.

Polarization gives rise to fixed charges at the interface formed between two layers of material with different polarization. Because the polarization charges are fixed, they do not themselves contribute to electrical transport in the crystal, however, the polarization charges can affect the concentration of mobile carriers. The polarization charges are present when the polarization field within the crystal is changing with distance. For example, the discontinuity in the polarization that arises at an interface between two materials having different polarization gives rise to a sheet charge density that is proportional to the change in the polarization across the interface.

When fixed charges are present at the interface, the fixed charges are neutralized by mobile charges in the material. The amount of mobile charge that the polarization charges induce at the interface of two nitride layers is dependent on the composition and structure of the crystal. In the case of AlGaN, for example, the aluminum composition of the AlGaN at the junction determines the amount of polarization and thus the amount of mobile charges induced at the interface. Note that polarization enhanced doping may be applied to carriers of either type. In nitride based light emitting devices, polarization enhanced doping is particularly relevant to enhancing hole concentration due to the difficulty of doping the nitride layers to achieve high p-type donor concentrations and simultaneously providing high conductivity layers.

In some UV LEDs, the p-side going portion of the emitted light is lost through optical absorption at the p-side heterostructure of the device. As previously mentioned, the UV LED designs described herein use a transparent electron blocking hole transporting layer (TEBHTL) that combines the functions of an electron blocking layer and a hole transporting layer. The TEBHTL is substantially optically transparent at the wavelengths emitted by the active region and is compositionally graded, e.g., in Al content, from the active region to the p-side electrical contact layer. The transparency of the TEBHTL enables the p-side-going light to be extracted out of the device for use in some implementations. Light extraction from the device can be enhanced by placing an appropriate reflector on the p-side of the device. The reflector redirects a portion of the p-side-going light back toward the substrate, thus allowing that portion of the light to join the n-side-going half and contribute to the overall output power of the LED.

FIG. 1 illustrates an LED structure 100 in accordance with some embodiments. Some layers of the LED structure 100 may comprise an Al containing III-nitride material. LED layers 120-150 are disposed on a substrate 110. The substrate may comprise AlN, such as a bulk crystalline AlN substrate. N-type layers 120 are arranged closest to the substrate 110 in this design. An active region 130 is disposed on the N-type layers 120 and can include one or more quantum wells separated by quantum well barrier layers. The quantum wells are configured to emit light at wavelengths less than equal to about 300 nm, or in the range of about 200 nm to about 365 nm, e.g., 290 nm. LED structure 100 includes a TEBHTL 140 that is transparent to the emitted light, compositionally graded with Al, and p-doped. In some embodiments, the TEBHTL comprises AlGaN or other III-nitride material, e.g., InAlGaN or InAlN. For example, the TEBHTL 140 may be an $Al_xGa_{1-x}N$ layer where x is a function of distance from the active region.

The TEBHTL 140 is arranged between the active region 130 and the contact layer 150 and is graded in Al composition from $x=x_{upper}$ proximate to the active region 130 to $x_{lower}$ proximate to the contact layer 150, where $x_{upper} > x_{lower}$ and may be as high as 100%. In various implementations, the TEBHTL 140 may be graded to have an $x_{upper}$ between about 100% to about 80% Al proximate to the active region 130 and $x_{lower}$ of about 70% to about 55% Al proximate to the contact layer 150. For example, in some embodiments, the TEBHTL 140 may be graded to have an $x_{upper}$ of about 100% Al proximate to the active region 130 and $x_{lower}$ of about 55% Al proximate to the contact layer 150. In other embodiments, the TEBHTL 140 may be graded to have an $x_{upper}$ of about 90% Al proximate to the active region 130 and $x_{lower}$ of about 60% Al proximate to the contact layer 150. The lower Al composition, $x_{lower}$, is selected to be sufficiently high so that the entire graded TEBHTL 140 is transparent at the wavelength of the emitted light. In some embodiments, the Al composition in the quantum well portion of the active region 130 is less than the minimum Al composition, $x_{lower}$, in the TEBHTL. This compositional structure ensures that the TEBHTL can be transparent to light emitted from the active region.

The grading of the TEBHTL 140 may result in a linear, non-linear, piece-wise linear, or other compositional profile. For example, possible profiles include, but are not limited to, a linear profile that is monotonically decreasing in Al composition, a non-linear Al composition profile, and a stepped Al composition profile. The decrease in Al composition in the TEBHTL 140 can occur over a majority of the thickness of the TEBHTL 140, i.e., 50% or more of the thickness, or at least about 85% of the thickness, or over substantially all of thickness, where the thickness of the TEBHTL may range from about 15 nm to about 75 nm, or about 30 nm, for example.

The TEBHTL may have a superlattice structure that is compositionally graded. For example, the superlattice structure can include multiple sub-layer pairs of AlGaN, or other Al containing III-nitride material, wherein the Al composition of the sub-layers and/or the thickness of the sub-layers changes as a function of distance from the active region. One may specify a superlattice consisting of $N_p$ pairs by giving the compositions and thicknesses of each of the two sublayers in each pair. Pair number 1 is proximate the active region and pair $N_p$ is proximate the contact layer. The composition of the relatively higher Al composition sub-layer of the $n^{th}$ pair has a value $C_h(n)$, and the composition of the relatively lower Al composition sub-layer of the $n^{th}$ pair has a value $C_l(n)$. Likewise, the thickness of the high Al composition sub-layer of the nth pair has a value $T_h(n)$, and the thickness of the low Al composition sub-layer of the nth pair has a value $T_l(n)$. The Al compositions $C_h(n)$ and $C_l(n)$ are in all cases larger than the Al composition in the active region.

In some embodiments $C_h(n)$ is greater than or equal to $C_h(n+1)$ for each n and $C_l(n)$ assumes a fixed value in the range from 50% to 60%. $C_h(1)$ may be in the range from 70% to 100% and $C_h(N_p)$ may be in the range from 50% to 70%. $T_h(n)$ and $T_l(n)$ may each be in the range from 0.7 nm to 5 nm. For example $T_h(n)=T_l(n)=0.75$ nm for each n. In some other embodiments $T_h(n)$ is greater than or equal to $T_h(n+1)$ for each n. One may characterize a pair of sublayers by the average Al composition in the pair defined as $C_{ave}(n)=(C_h(n)T_h(n)+C_l(n)T_l(n))/(T_h(n)+T_l(n))$. The corresponding average energy band-gap of the pair, $E_{ave}(n)$, can be specified as a function of $C_{ave}(n)$. This function is such that $E_{ave}(n)$ decreases as $C_{ave}(n)$ decreases. In some embodiments $C_{ave}(n)$ is greater than or equal to $C_{ave}(n+1)$ for each of the $N_p$ pairs. In these embodiments the average energy gap $E_{ave}(n)$ is a decreasing function of n for n=1 to n=$N_p$.

In some configurations, a superlattice TEBHTL includes sub-layers of AlGaN having a relatively higher amount of Al alternating with sub-layers of AlGaN having a relatively lower amount of Al. Both the higher Al containing sub-layers and the lower Al containing sub-layers include more Al than the quantum wells of the active region and/or are transparent to light emitted by the active region. The higher Al containing sub-layers can be graded from a first Al composition, e.g., 100% or 90% Al, in the first sub-layer of the superlattice TEBHTL proximate to the active region to a second Al composition, e.g., 50% or 60% Al, in the last sub-layer of the superlattice TEBHTL proximate to the contact layer. The lower Al containing sub-layers may be graded from a first Al composition, e.g., 80% or 70% Al, in the sub-layer of the superlattice TEBHTL proximate to the active region to a second Al composition, e.g., 50% or 60% Al, in the last sub-layer of the superlattice TEBHTL proximate to the contact layer. For example, in some embodiments the layer pair proximate the active region may consist of a high Al containing sublayer with an Al composition of 93% together with a low Al composition of 73%, and the layer pair proximate to the contact layer may consist of a high Al containing sublayer with an Al composition of 74% together with a low Al composition of 54%. For example, in some embodiments, 10 to 30 sub-layer pairs may be used in the graded superlattice TEBHTL, each sub-layer having a thickness of about 0.75 nm.

The Al composition in the quantum wells of the active region 130 can be less than about 70%, e.g., about 40%, and the barriers between the quantum wells can be less than about 85%, e.g., about 55%. The Al composition in the quantum wells can be less than $x_{lower}$. The TEBHTL 140 is doped p-type, with possible dopants being Mg, Be, C, or Zn. For example, if Mg is used as the p-type dopant, the Mg concentration may be in the range from $5 \times 10^{18}/cm^3$ and $5 \times 10^{21}/cm^3$.

The contact layer 150 is a thin, highly doped layer disposed on the TEBHTL and configured to make good electrical contact with the TEBHTL. The contact layer 150 may comprise GaN or another III-nitride material, e.g., InGaN and is thin enough so that the layer 150 is optically transparent to the emitted light. For example, the thickness of the contact layer 150 may be less than about 50 nm, less than about 30 nm, e.g., about 15 nm, or other thickness that provides for a substantial amount of light to be transmitted through the layer 150. The thinness of the contact layer 150 also provides for high dopant concentrations without causing cracking. The highly doped, transparent contact layer 150 allows for good hole injection in the TEBHTL. Suitable p-dopants for the contact layer 150 include Mg, Be, C, or Zn, for example. The dopant may be present in the contact layer 150 at a concentration greater than about $1 \times 10^{19}$, for example.

Figure 2:
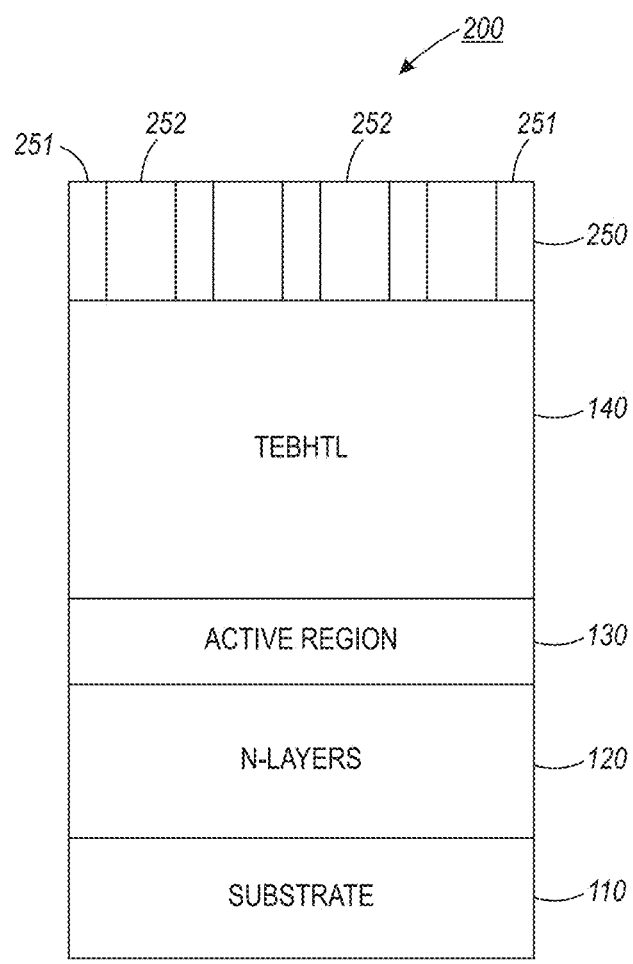
FIG. 2 is a cross section of an LED structure that includes a TEBHTL and metallic mirrors that reflect ultraviolet (UV) light in accordance with some embodiments.

FIG. 2 is another example of an LED structure 200 that includes a TEBHTL 140. The LED structure 200 is similar is some respects to the LED structure 100 shown in FIG. 1. In the LED configuration shown in FIG. 2, the electrical contact layer comprises a composite electrical contact layer 250 that includes two materials. The composite electrical contact layer 250 includes regions of a first material 251, e.g., GaN or another III-nitride material, disposed on the TEBHTL layer 140 and regions of a second material 252 that is a metallic UV mirror material disposed on the TEBHTL. As shown in FIG. 2, the first material 251 and second material 252 may be distributed or patterned across the surface of the TEBHTL 140. The composite electrical contact layer 250 shown in FIG. 2 may have a thickness of less than about 50 nm, or less than about 30 nm, or less than about 20 nm, e.g., about 15 nm, and provides enhanced reflectivity of the p-side light.

Simulations show that the use of a TEBHTL as described herein provides efficient hole injection into the active region.

Figure 3A:
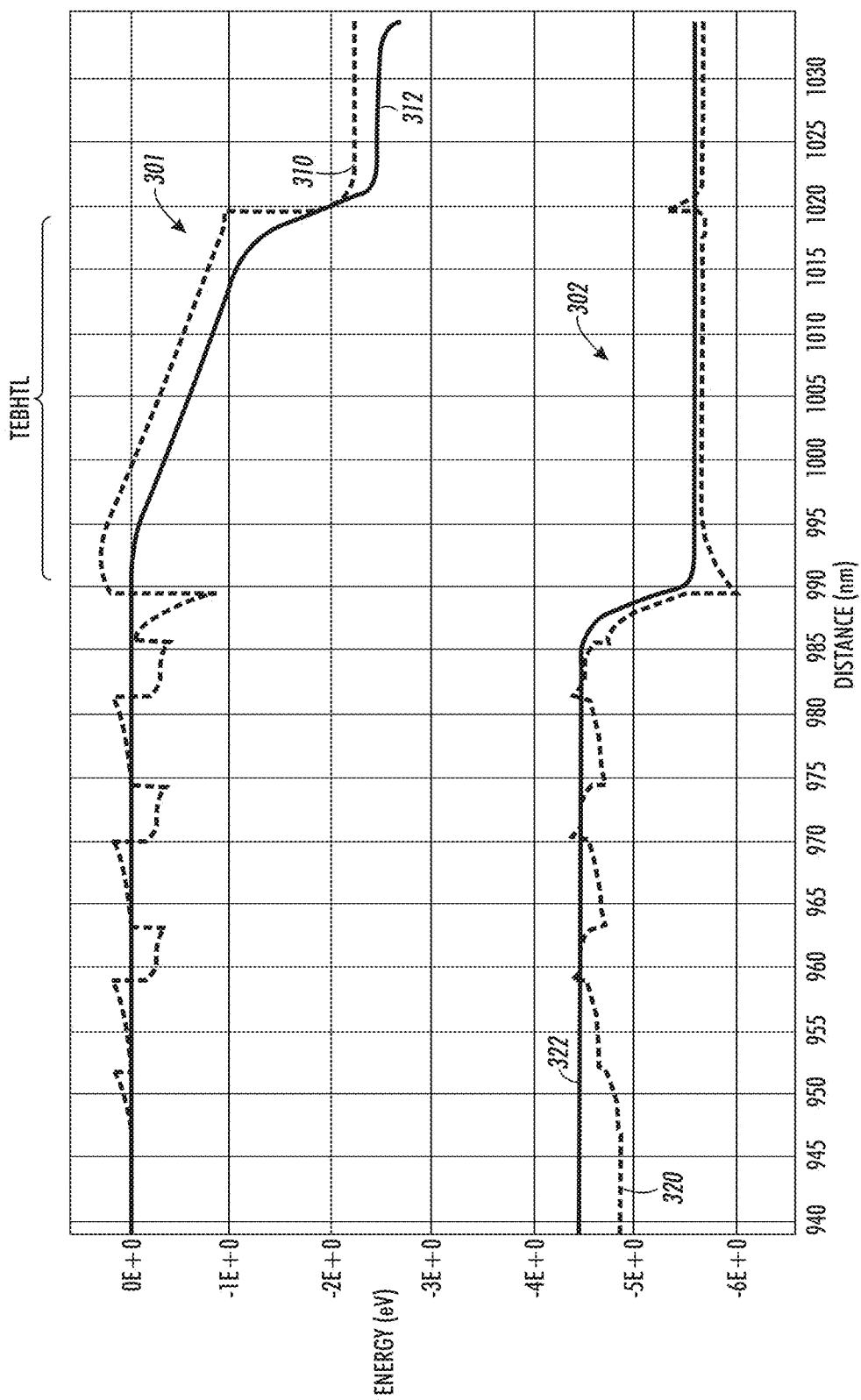
FIG. 3A is a band diagram of a UV LED with a continuously graded TEBHTL.

In Al-containing $Al_xGa_{1-x}N$ materials, the variation in the Al composition in the TEBHTL affects the energy band structure within the LED. FIG. 3A shows the simulated conduction 301 and valence 302 band edge energies as a function of distance in the active region, a continuously graded TEBHTL (in the region indicated in FIG. 3A), and electrical contact layer. The device of FIG. 3A includes an AlGaN TEBHTL that is continuously graded from 100% Al at the active region to 55% Al proximate the electrical contact. The total thickness of the TEBHTL is 30 nm.

In FIG. 3A, trace 310 represents the conduction band level, trace 320 represents the valence band, trace 312 is the conduction band quasi-Fermi level, and trace 322 is the valence band quasi-Fermi level. The band-gap of the TEBHTL decreases as a function of distance from the active region to the electrical contact layer over a majority of the thickness of the TEBHTL.

Figure 3B:
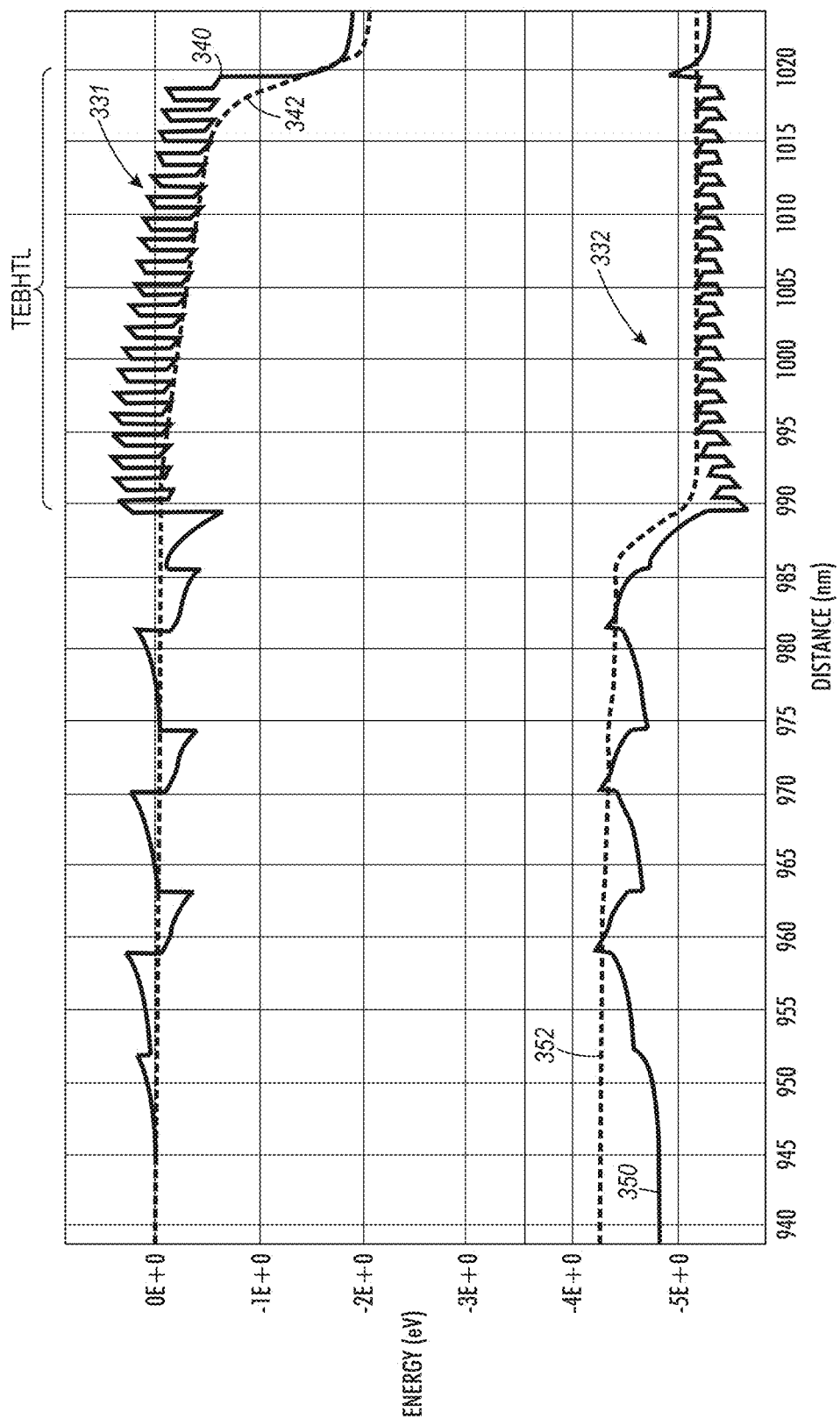
FIG. 3B is a band diagram of a UV LED with a graded superlattice TEBHTL.

FIG. 3B shows the simulated conduction 331 and valence 332 band edge energies as a function of distance in the active region, a graded superlattice TEBHTL (in the region indicated in FIG. 3B), and electrical contact layer. The graded superlattice TEBHTL shown in FIG. 3B is formed from 20 pairs of AlGaN sublayers. Each of the two sublayers, L1 and L2, has a thickness of 0.75 nm. The total thickness of the graded superlattice TEBHTL is 30 nm. The Al composition of L1 is 0.93 proximate the active region. In each sub-layer pair the composition of L2 is less than L1 by 0.20. This structure is graded in Al composition from (0.93, 0.73) proximate the active region to (0.74, 0.54) proximate the electrical contact.

In FIG. 3B, trace 340 represents the conduction band, trace 350 represents the valence band, trace 342 is the conduction band quasi-Fermi level, and trace 352 is the valence band quasi-Fermi level. The average band-gap of the sub-layer pairs of the graded superlattice TEBHTL decreases as a function of distance from the active region to the electrical contact layer over a majority of the thickness of the TEBHTL.

Energy values in these energy band diagrams (and other energy band diagrams included herein) are shown in eV along the y axis, with distance referenced from d=0 proximate to the N-layers (120 in FIGS. 1 and 2) and extending in the positive direction to the right along the x axis which corresponds to the [0001] direction. The injection efficiency is defined to be $J_{rad}/J_{tot}$ where $J_{rad}$ is the radiative current and $J_{tot}$ is the total current. In these simulations, the TEBHTL s configured to block electrons from overshooting the active region. In the continuously graded TEBHTL simulation, the injection efficiency is shown to be 95%. In the graded superlattice TEBHTL simulation, the injection efficiency is shown to be 60%. In various embodiments, the injection efficiency of LEDs incorporating TEBHTLs as disclosed herein is greater than about 50%.

Figure 4:
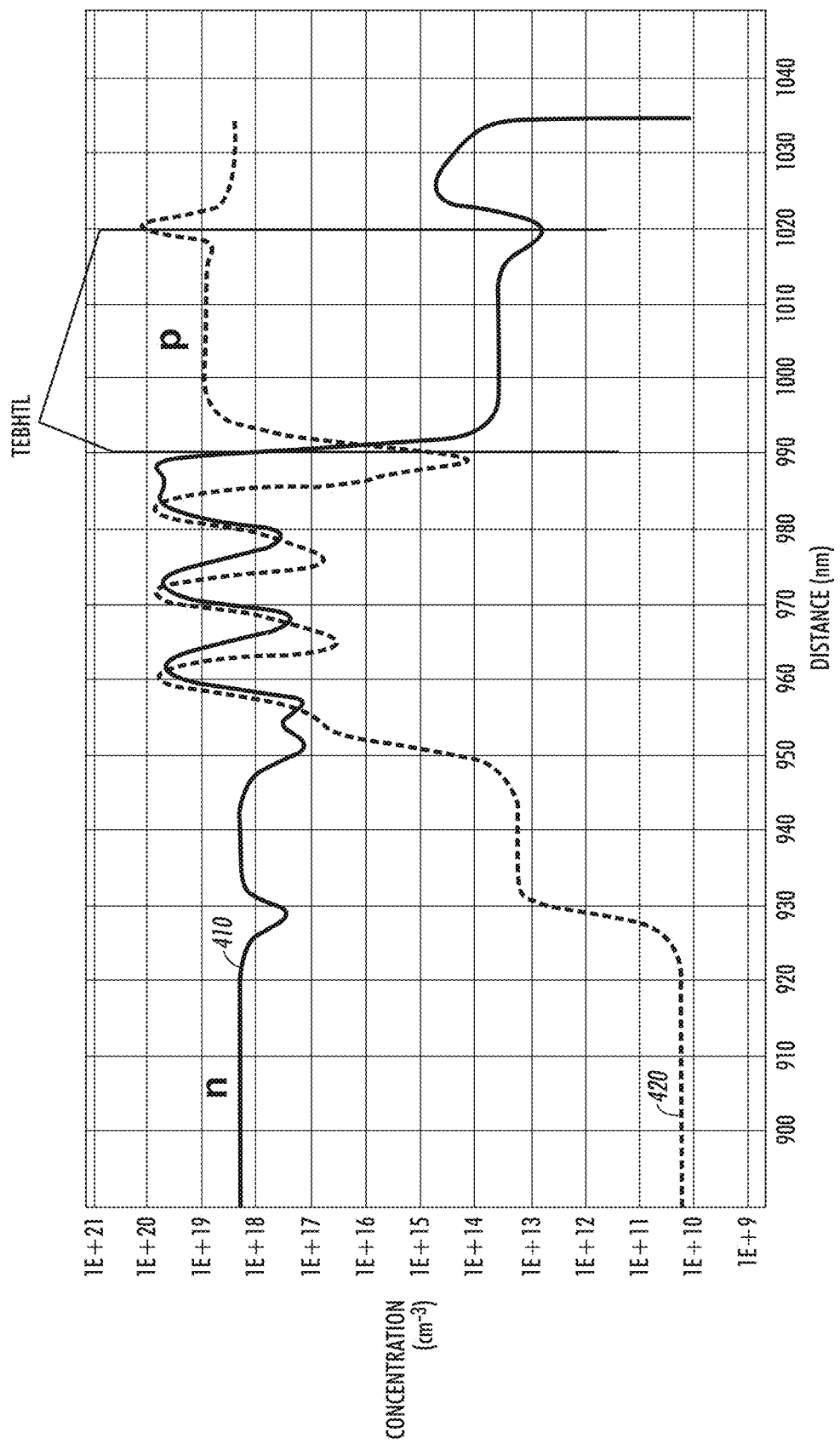
FIG. 4 provides graphs of calculated electron and hole concentrations of a UV LED that includes a TEBHTL.

FIG. 4 shows plots of electron 410 and hole 420 concentration with respect to distance in the active region, TEBHTL (in the region indicated in FIG. 4), and p-contact layer for the device of FIG. 3A. From these concentration plots 410, 420, it is evident that the electron concentration is suppressed in the TEBHTL region indicated in FIG. 4. The grading of the TEBHTL facilitates the formation of relatively high hole concentration between the contact layer and the active region. The high hole concentration facilitates good hole conductivity on the p-side of the device. The TEBHTL suppresses electron concentration on the p-side of the device.

Figure 5:
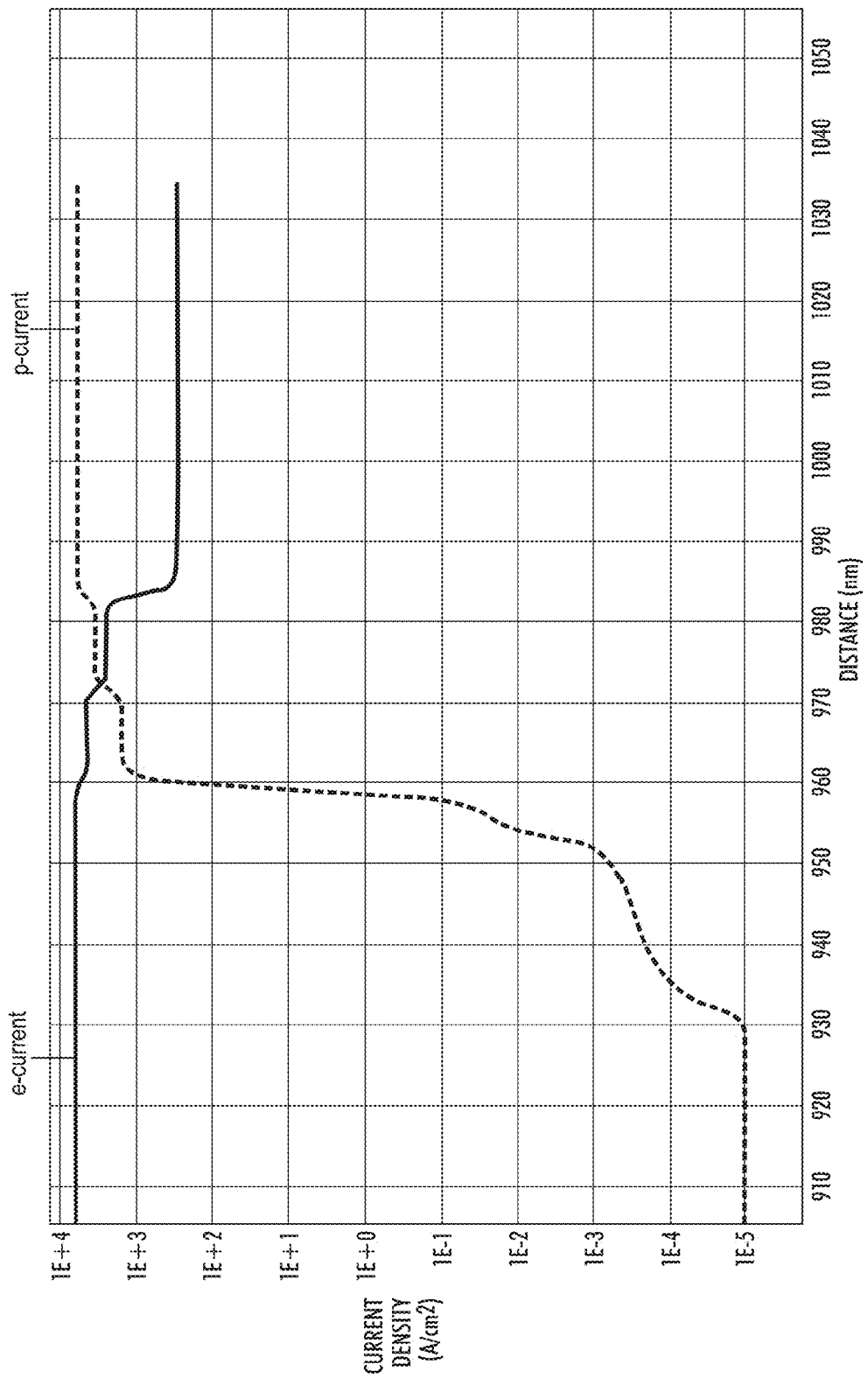
FIG. 5 shows graphs of calculated electron and hole currents in a UV LED that includes a TEBHTL.

FIG. 5 shows the electron current (e-current) and hole current (p-current) in the device of FIG. 3A. Electron current flows from a n-contact located proximate the n-layers towards the active region where the electrons recombine with holes. About 95% of the electrons injected recombine radiatively with holes in the active region.

In some embodiments, the composite electrical contact layer may include one or more sub-layers. For example, the composite electrical contact layer may include a first sub-layer disposed on the TEBHTL and comprising GaN or other III-nitride material as previously discussed in connection with FIG. 1. The composite electrical contact layer may further include one or more sub-layers disposed on the first sub-layer, wherein one of the sub-layers is a metal sub-layer. Examples of materials that are suitable for the sub-layers of the composite electrical contact layer include Ni/Au alloys or indium tin oxide (ITO), among others that will be discussed in more detail below.

Figure 6:
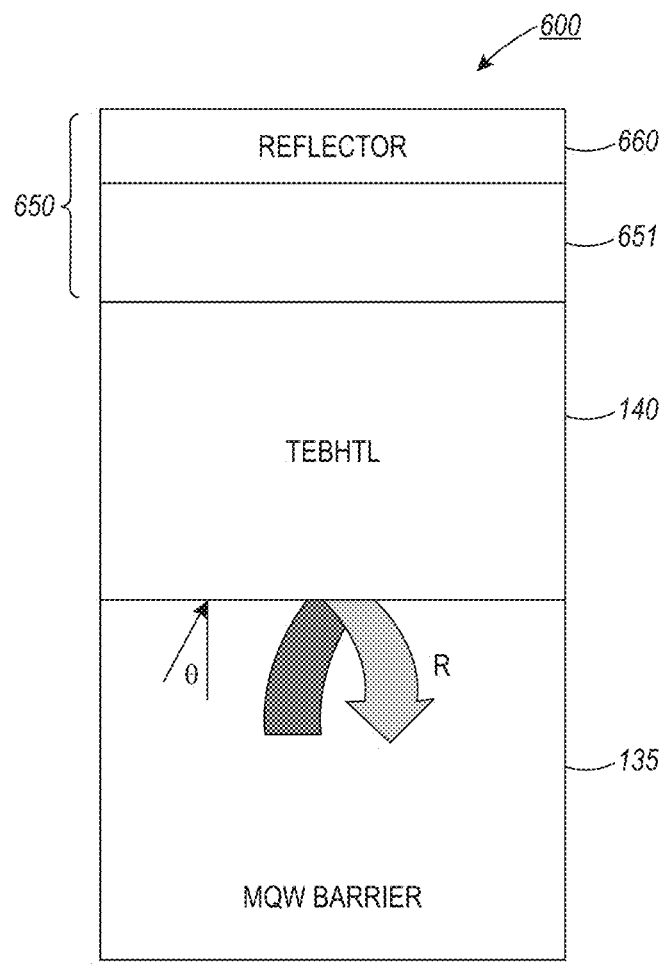
FIG. 6 shows the top portion of a UV LED that uses a TEBHTL in accordance with some embodiments.

FIG. 6 shows an illustration of UV LED structure 600 comprising the top half of a λ=290 nm UV LED utilizing a TEBHTL 140. The portion of the structure 600 shown in FIG. 6 shows the last multiple quantum well (MQW) barrier 135 of the active region and can have, for example, the composition $Al_{0.5}Ga_{0.5}N$. The TEBHTL 140 has a composition that is graded from AlN at the MQW barrier 135 to $Al_{0.55}Ga_{0.45}N$ at the composite electrical contact layer 650.

The composite electrical contact layer 650 disposed on the TEBHTL 140 includes at least two materials, at least one of the two materials is a metal that reflects light emitted by the active region. In this embodiment, one of the two materials of the composite electrical contact layer 650 is embodied in a first sub-layer 651 that provides electrical contact to the AlGaN. The first sub-layer 651 is disposed directly on the TEBHTL and may comprise GaN or other III-nitride material having the thickness and doping concentration as previously discussed. GaN is optically absorbing at λ=290 nm, but when GaN is used as the first sub-layer 651, the GaN layer can be made thin, e.g., less than about 30 nm, or about 15 nm, or other thickness that provides for a substantial amount of light to be transmitted through the layer.

The second of the two materials of the composite contact layer 650 is embodied as a reflector sub-layer 660 that is made of a metal that is reflective at the emitted wavelengths. The reflective sub-layer 660 is placed above or directly on the initial sub-layer 651. In some configurations, the reflective sub-layer 660 not only redirects light, but also functions as an external electrical contact for the device. In this configuration, the reflector 660 may have an electrical resistivity less than about $8 \times 10^{-4}$ ohm-cm. Possible reflective and electrically conductive materials suitable for the reflector 660 include metals such as Al, Ag, Au, Pd, Cr/Au and Ni/Au alloys.

A portion of the light emitted at the active region will be directed toward the n-side of the device, and a portion will be directed toward the p-side of the device. The reflectivity, R, seen by the p-side going portion of the light depends on the angle of incidence, θ, of the light as shown in FIG. 6.

Figure 7:
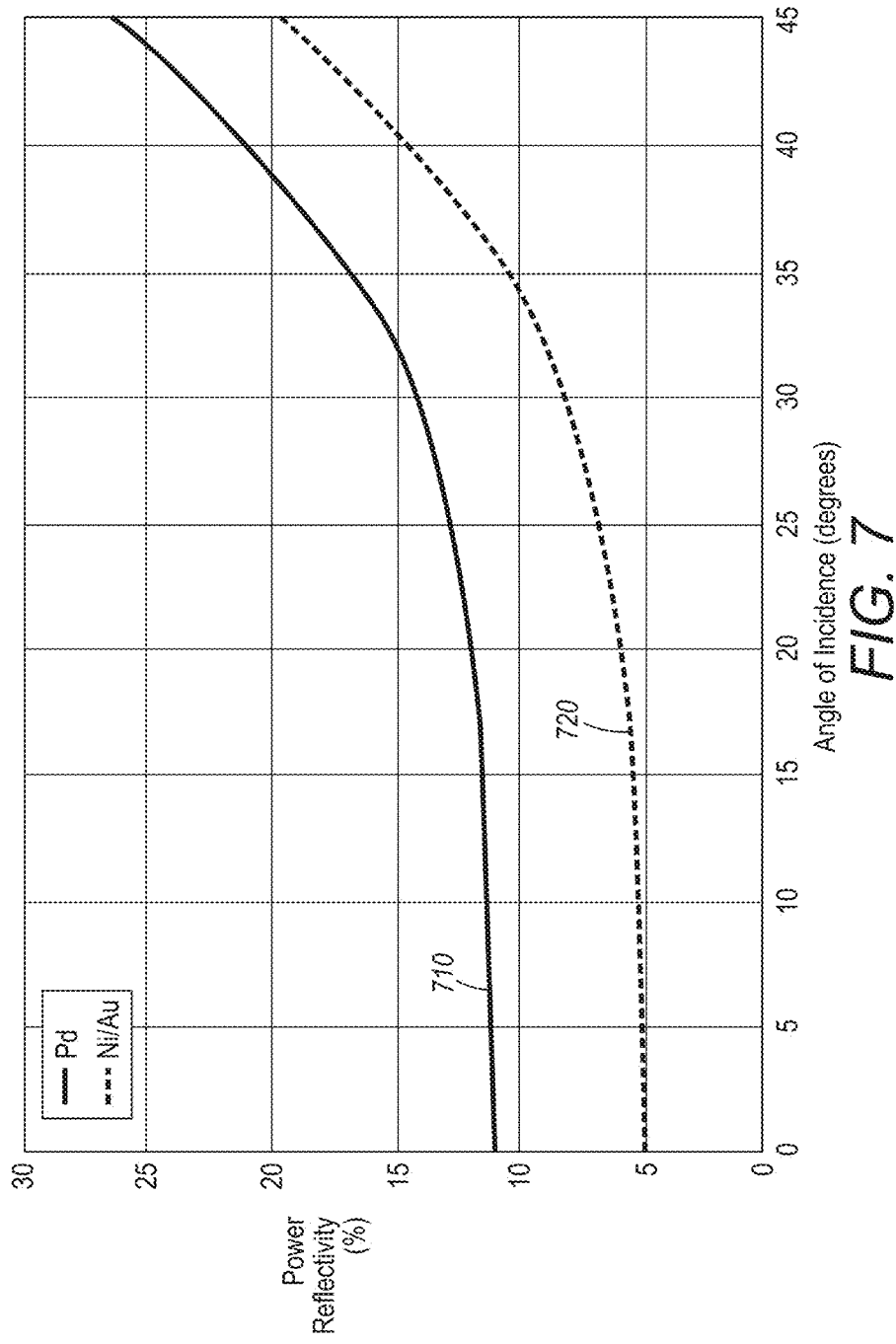
FIG. 7 shows graphs of reflectivity vs. angle of incidence for Pd and for Ni/Au reflector contacts.

FIG. 7 plots the calculated power reflectivity as a function of incident angle for Pd 710 (solid line) and Ni/Au 720 (dashed line) reflectors. For Pd metal contacts, the reflectivity ranges from 11% to 26% corresponding to angles of incidence ranging from 0° to 45°, respectively. For many 20 nm/120 nm Ni/Au metal contacts, the reflectivity ranges from 5% to 19%.

Figure 8A:
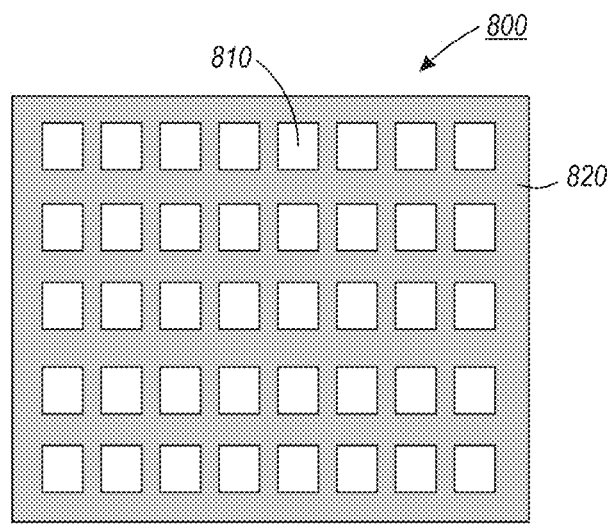
FIG. 8A is a plane view of an array of etched p-GaN padlets.
Figure 8B:
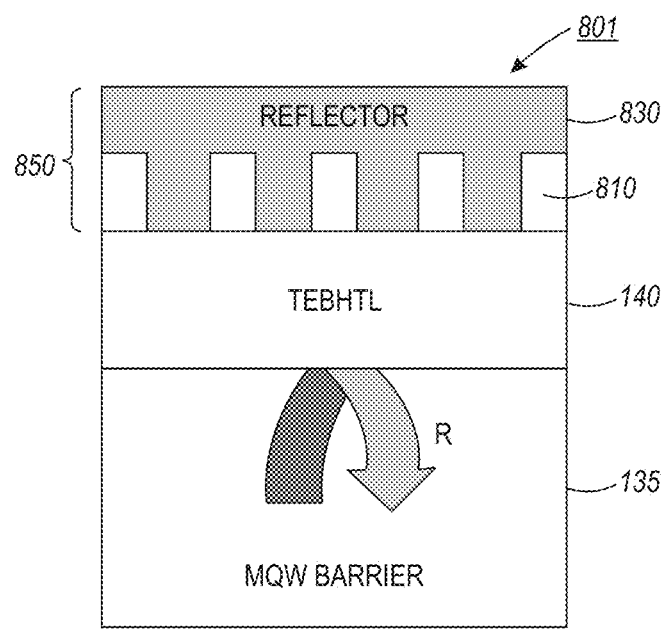
FIG. 8B is a cross section of an LED structure after deposition of a reflecting contact on the p-GaN padlets.

The reflectivity values can be increased by removing a portion of the first sub-layer, and then replacing some or all of the removed material by a different material. This process can be illustrated by assuming GaN is used as the first sub-layer material. For purposes of illustration, some embodiments refer to GaN as a material for the first sublayer, however, it is to be understood that other III-nitride materials could be used instead of GaN. Part of the initial GaN sub-layer can be etched away to form an array of smaller contact GaN padlets 810 separated by substantially GaN-free regions 820, as shown in FIG. 8A. FIG. 8A shows a plan view of the intermediate structure 800 comprising the array of GaN padlets 810 and substantially GaN-free regions 820. After the padlets are formed, reflecting contact 830 can be formed above the structure 800, as shown in FIG. 8B to form a composite electrical contact layer 850. In this embodiment, padlets 810 may be spaced close together to prevent too much pixilation in the spatial distribution of the emitted light. A possible geometry could be 2 micron×2 micron-sized padlets separated by 2 micron gaps of GaN-free regions in both lateral directions. FIG. 8B shows a corresponding cross sectional view of an LED structure 801 after deposition of the reflecting contact 830. Region 810 and 830 together form a composite electrical contact layer 850, a portion of which (830) is a metal that reflects light. In this embodiment, the thickness of the GaN layer may be less than about 50 nm, or less than about 30 nm, e.g., about 15 nm.

FIG. 9 shows plots of the calculated reflectivity for Pd, Ni/Au, and Al reflectors 910, 920, 930, respectively, with respect to angle of incidence at the interface between the light-emitting active region and the TEBHTL at the GaN-free regions. For Pd metal reflector (830, FIG. 8B), the reflectivity at direct incidence increases from 11% at the GaN padlet region to 34% at the GaN-free region. At a 45° angle of incidence, the reflectivity increases from 26% at the GaN padlet region to 62% at the GaN-free region. For a device with 50% fill factor (50% of the p-GaN contact area removed), the spatially averaged reflectivity is about 22% to 44% for angle of incidences ranging from 0° to 45°, respectively. The corresponding average reflectivity for a device that utilizes 20 nm/120 nm Ni/Au metal contacts is 12% to 33%.

FIG. 9 shows that Al reflectors can be quite effective, with reflectivity values ranging from 87% to 93%. However, in some implementations, Al may not form good electrical contacts with p-doped GaN or other p-doped III-nitride materials. Therefore, in some embodiments the composite electrical contact may employ a different material to form external electrical contacts with the p-GaN surface.

Figure 10A:
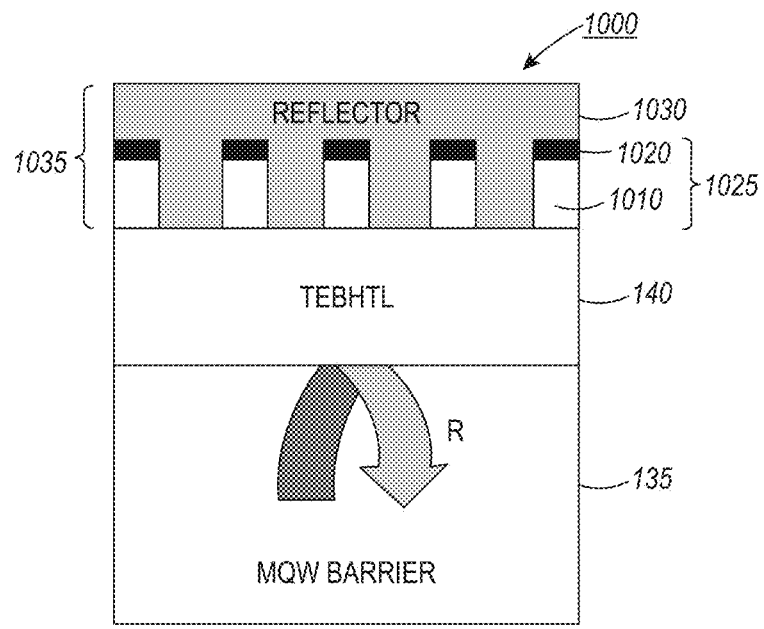
FIG. 10A is a block diagram of an LED structure that uses different materials for the p-contact and the reflector.

FIG. 10A shows an LED structure 1000 that includes a TEBHTL 140 and composite electrical contact layer 1035. The composite electrical contact layer 1035 comprises padlets 1025, wherein each padlet 1025 includes a first sub-layer 1010, e.g., a semiconductor such as GaN, disposed directly on the TEBHTL 140 and a second sub-layer 1020 disposed directly on the first sub-layer 1010. Possible materials for the second sub-layer 1020 include metals such as Pd, Ni, Ni/Au, or a conducting oxide, such as indium tin oxide (ITO). A reflector 1030 is disposed over the padlets 1025. Possible materials for the reflector 1030 include electrically conductive materials including metals, such as Ni/Au, Pd, Al, Au, Ag. In some embodiments the reflector can include dielectric materials that are layered to form a distributed Bragg reflector.

The padlets 1025 can be formed by depositing an unpatterned layer of the first material on the TEBHTL 140, depositing an unpatterned layer of the second material on the first layer and then patterning and etching the layers of the first and second materials together to form the padlets 1025 that include first and second padlet sub-layers 1010, 1020. This process forms multi-layer, self-aligned padlets 1025 as shown in FIG. 10A.

In some implementations, the padlets 1025 are formed by depositing and patterning the first material to form the first padlet sub-layers 1010, depositing a metal on top of the first padlet sub-layers 1010 and annealing the metal after it is deposited. The reflector 1030 is disposed over the annealed metal padlet sub-layers 1020 and in the gaps between the padlets 1025. In the arrangement shown in FIG. 10A, the reflector material 1030 is disposed directly on the padlets a 1025 and also directly on portions of the TEBHTL 140.

The reflector overcoat 1030 can be deposited on the entire top surface including the exposed surfaces of the padlets 1025 and TEBHTL 140. If an electrically conductive reflector such as Al is chosen, the reflector overcoat 1030 can also function to electrically connect all the contact padlets 1025 into a single overall contact pad. Additional overcoats such as Ti/Au could be deposited on top of the reflector 1030 to provide better protection from the environment or to facilitate electrical connections with other electronic components. In some embodiments, Al is used as a reflector layer 1030, Pd is used as the second padlet layer 1020 disposed on a first padlet layer 1010 of GaN or other III-nitride material, wherein the padlets have a spacing of a 50% fill factor. For this embodiment, the average reflectivity would be 49% to 60%.

Figure 10B:
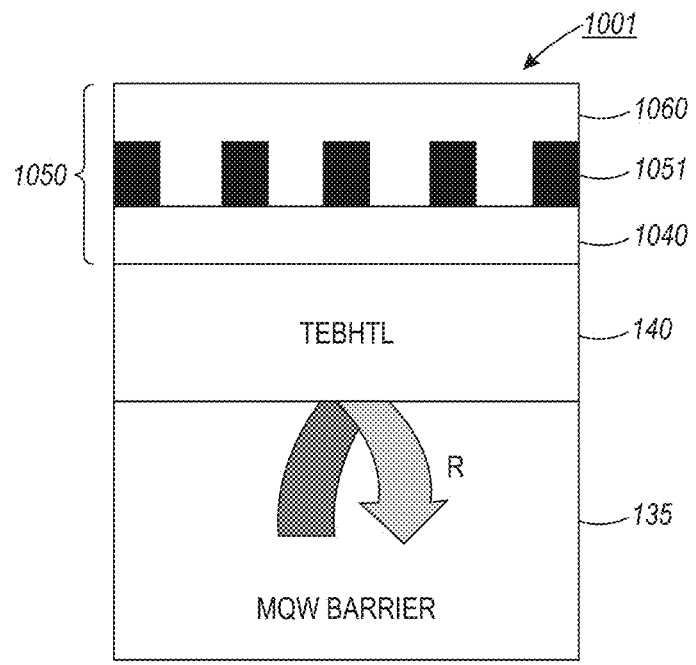
FIG. 10B shows a block diagram of an LED structure wherein the electrical contact layer itself is not patterned.

FIG. 10B shows an embodiment of an LED structure 1001 that includes composite electrical contact layer 1050 having a first sub-layer 1040 in direct contact with the TEBHTL. In this embodiment, the first sub-layer 1040 is unpatterned and may comprise a layer of GaN or other III-nitride material that is thin enough to be substantially optically transparent and is highly doped to create a good electrical contact with the TEBHTL as discussed previously. The thickness of sub-layer 1040 should typically be less than 50 nm to prevent excessive optical absorption. However, homogeneous film coverage could become a problem if layer 1040 is made too thin. In some embodiments, layer 1040 has a thickness of 15 nm. In this embodiment, a metal is deposited on the sub-layer 1040 and is annealed. The annealed metal is patterned to form an array of padlets 1051 on top of the layer 1040 with gaps between the metal padlets 1051. The reflector 1060 is disposed in the gaps and over the metal padlets 1050 and may be in direct contact with layer 1040.

Some implementations do not involve patterning the semiconductor layer disposed on the TEBHTL and also provide good reflectivity. A layered architecture for the composite electrical contact layer, such as the embodiment illustrated in FIG. 6 (composite electrical contact layer 651, FIG. 6), can provide superior contact resistance, simpler device processing, and more uniform light output distribution. FIG. 7 shows that metals used for external electrical contacts such as Pd and Ni/Au can provide some level of reflectivity when employed in the composite electrical contact 651 of FIG. 6, but the reflectivity values are relatively low. The reflectivity can be significantly increased using transparent contact materials as described in connection with FIG. 11.

Figure 11:
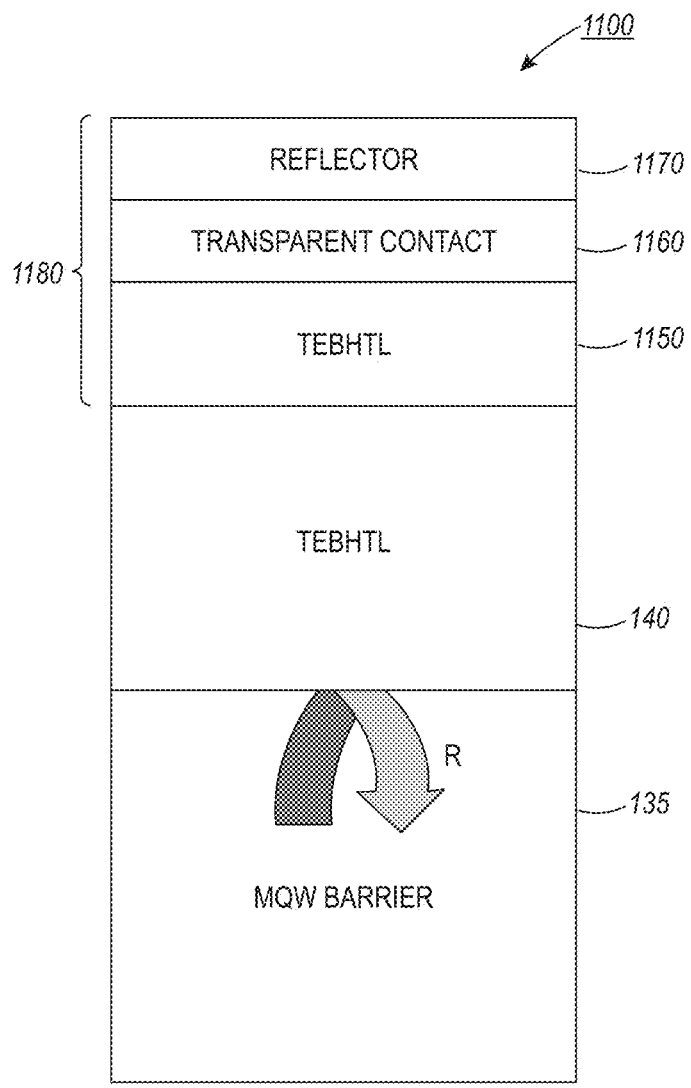
FIG. 11 is a block diagram of an LED that uses a transparent conductive contact and reflector overcoat.

FIG. 11 shows an embodiment of an LED structure 1100 comprising a TEBHTL 140 and a composite electrical contact 1180 that utilizes a transparent electrically conductive sub-layer 1160 on a first sub-layer 1150, e.g., a GaN or other III-nitride sub-layer as previously discussed. A reflecting overcoat 1170 is deposited above the transparent conductive sub-layer 1160. Possible materials for the transparent conductive sub-layer 1160 include electrically conductive oxides such as indium tin oxide (ITO) and zinc oxide (ZnO). Possible materials for the reflector sub-layer 1170 include Al, Ag, Au, Ni, Ti, Pd, their alloys, and combinations of conductive oxides and metals. In a specific example, ITO is used for the transparent conducting layer 1160 and Al for the reflecting overcoat layer 1170.

Figure 12A:
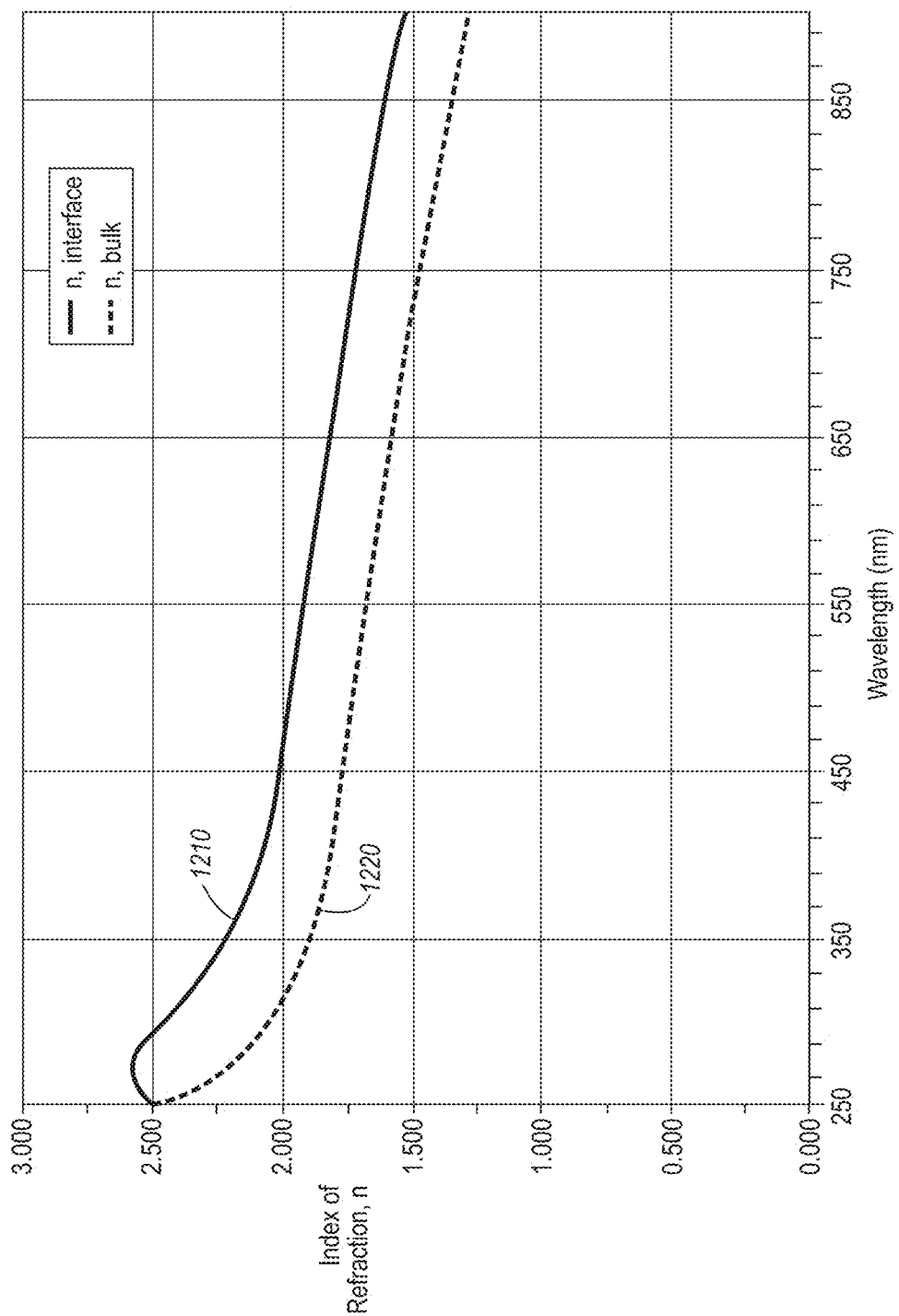
FIGS. 12A and 12B are measured real and imaginary parts, respectively, of the optical index of indium tin oxide (ITO) as a function of wavelength.
Figure 12B:
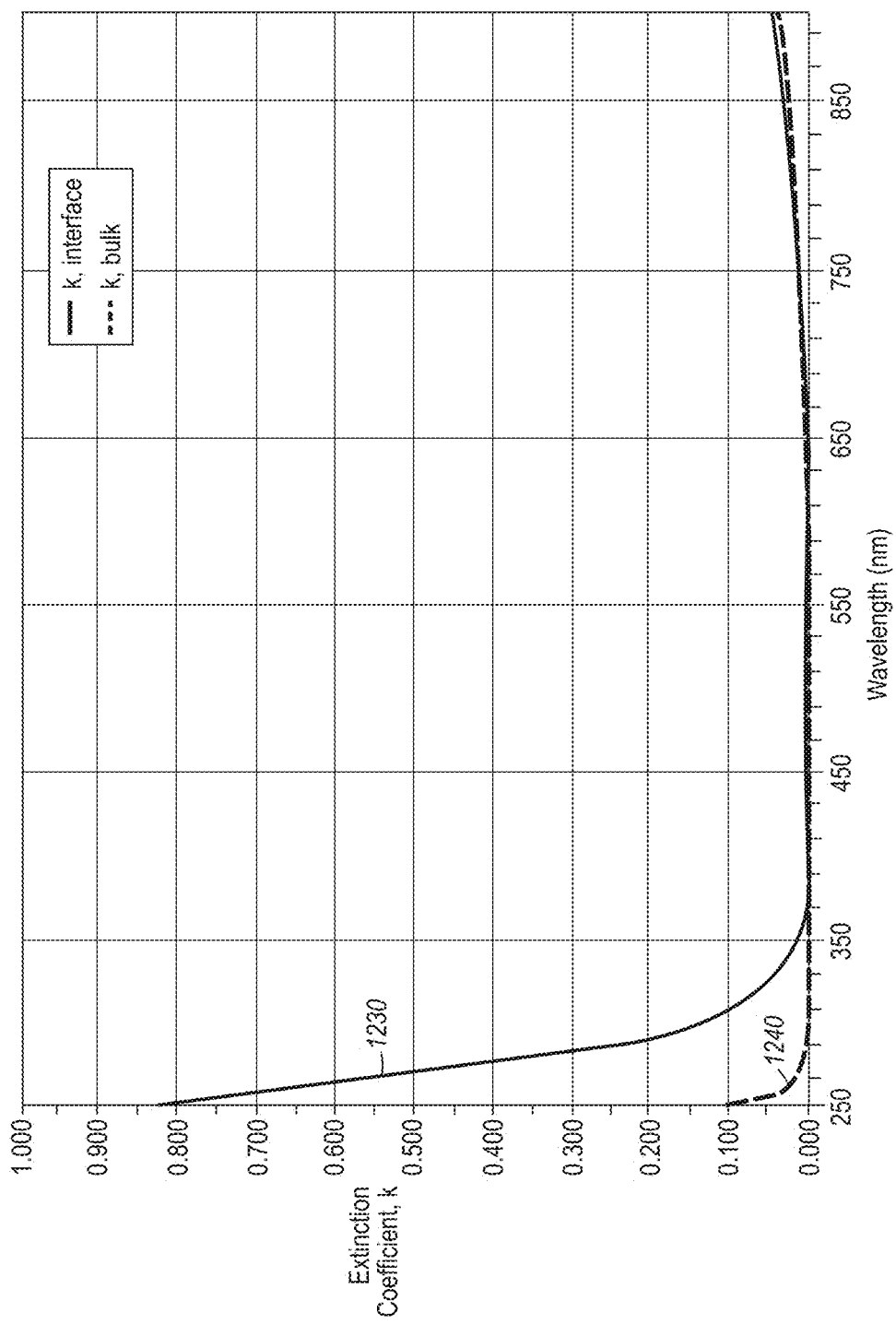

ITO deposition recipes in accordance with some embodiments produce films with suitable optical and electrical properties. For example, the ITO can be deposited using RF sputtering at an ambient pressure of 5 mTorr with an Ar flow rate of 100 sccm, an oxygen flow rate of 6 sccm, and an RF power of 100 mW. ITO deposited at this condition has good optical properties and produces good contacts with p-GaN when annealed at 350° C. The deposited ITO film segregates into two sections that have different optical index dispersion characteristics—a thin section at the interface with the p-GaN surface, and a bulk section above the thin layer. FIGS. 12A and 12B are graphs of the real and imaginary part of the optical index of ITO as a function of wavelength. FIG. 12A provides a graph 1210 of the measured dispersion characteristics of the index of refraction for the interface section and a graph 1220 of the measured dispersion characteristics of the index of refraction for the bulk section. FIG. 12B provides a graph 1230 of the measured dispersion characteristics of the extinction coefficient, k, for the interface section and a graph 1240 of the measured dispersion characteristics of the extinction coefficient for the bulk section.

Figure 13:
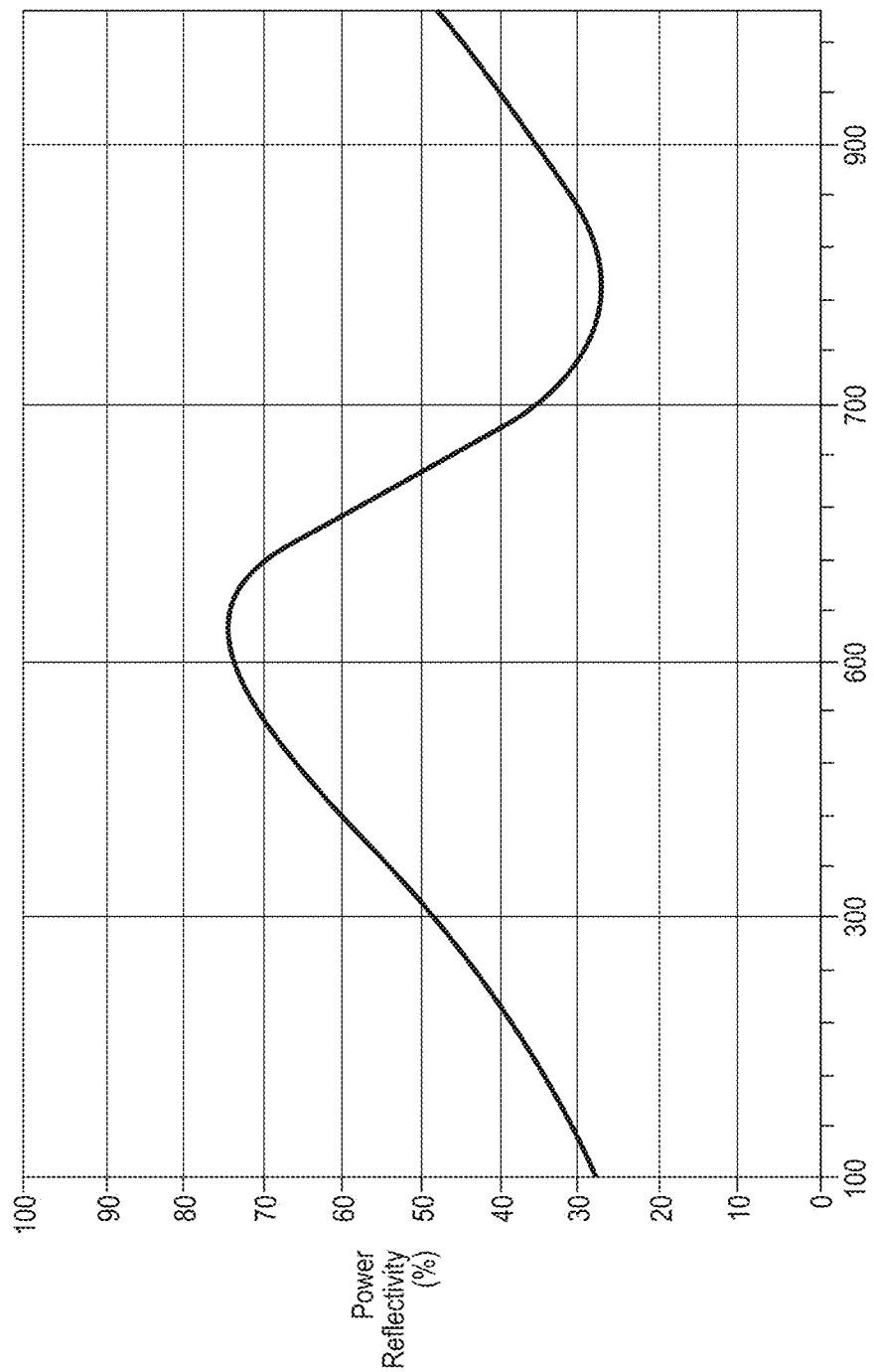
FIG. 13 is a graph of the on-axis reflectivity as a function of phase matching layer thickness.
Figure 14:
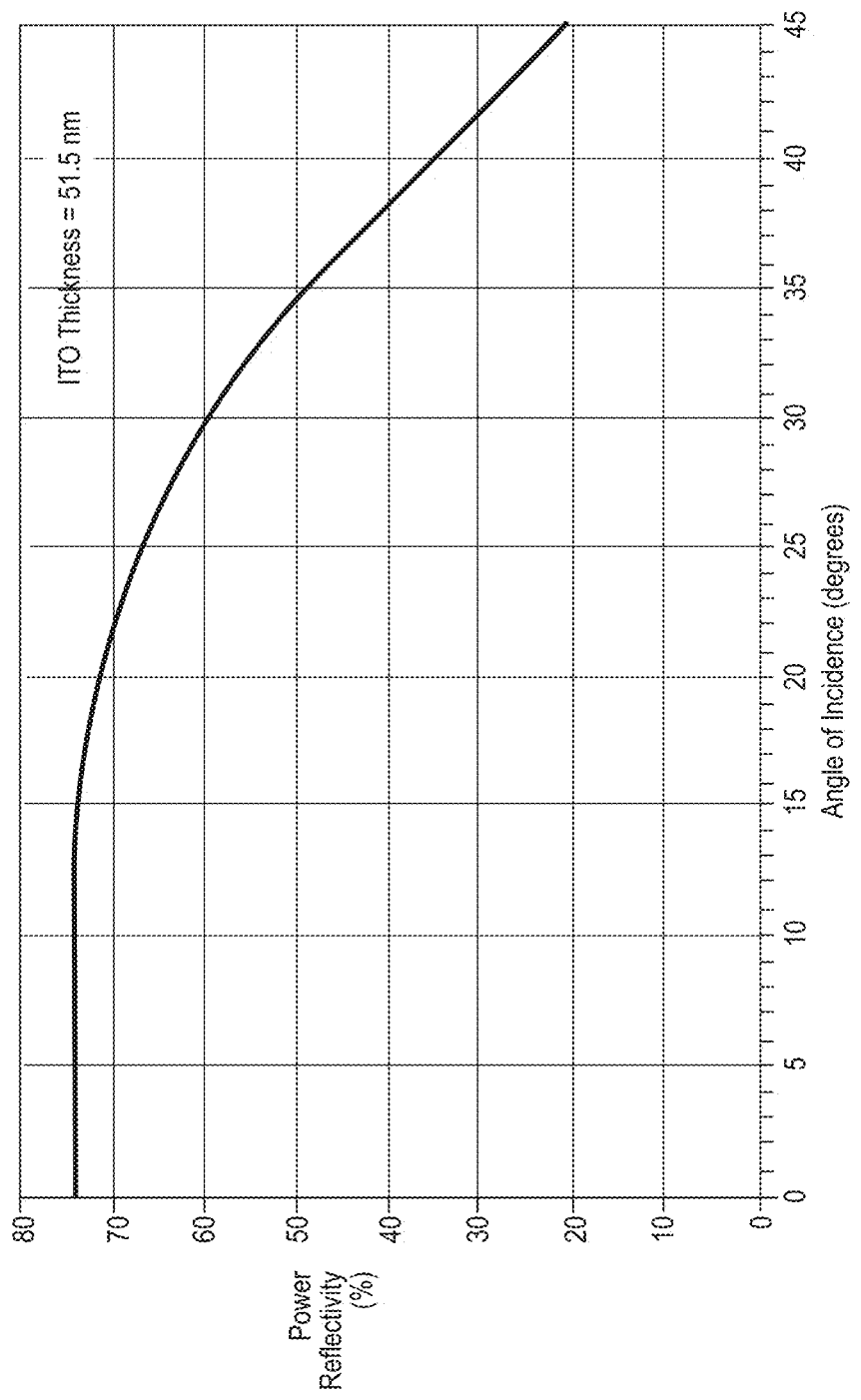
FIG. 14 is a graph of reflectivity vs. angle of incidence for a particular phase matching layer thickness.

The transparent conductive layer 1160 in FIG. 11 can also function as an optical phase matching layer. The thickness of layer 1160 can be adjusted to take advantage of resonance effects in the device in order to increase reflectivity. FIG. 13 shows the on-axis reflectivity as a function of ITO film thickness as seen from the active region of a $\lambda$=290 nm LED example. The optimum ITO thickness in this case is about 515 Å, for which the straight-on reflectivity achieves a value of 74%. FIG. 14 shows the reflectivity as a function of the angle of incidence for this optimum ITO film thickness. A reflectivity of over 70% can be achieved for angle incidence ranging of 0 to 20 degrees.

Embodiments disclosed herein involve LED structures that include an active region configured to emit light, an electrical contact layer and a TEBHTL. In some embodiments, the electrical contact layer is a composite electrical contact layer comprising two materials one of which is a metal configured to reflect the emitted light. The TEBHTL is arranged between the electrical contact layer and the active region and has a thickness that extends at least a majority of a distance between the active region and the electrical contact layer. The TEBHTL is transparent to light emitted by the active region, having a band-gap greater than a band-gap of light emitting portions of the active region. The light emitted by the active region can have a wavelength less than about 300 nm. The band-gap of the EBL decreases as a function of distance from the active region to the electrical contact layer over a majority of the thickness of the TEBHTL. The TEBHTL thickness may range from about 15 nm to about 75 nm, and can be less than about 50 nm, e.g., about 30 nm. In various embodiments the band-gap energy of the TEBHTL decreases linearly, piece-wise linearly, monotonically, or strictly decreases as a function of distance from the active region to the electrical contact layer.

The TEBHTL enables an UV-LED heterostructure that does away with a traditional hole spreading layer while still maintaining excellent carrier injection efficiency. In conventional LED structures, a hole spreading layer is placed between the electron blocking layer and the p-contact layer. Such hole spreading layers are optically absorbing for UV LEDs, so eliminating those layers is beneficial for improved light extraction. The TEBHTL combines the functions of the hole transporting layer and the electron blocking layer.

Suitable materials for the active region and the TEBHTL include an aluminum containing III-nitride material. For example, the active region and/or the TEBHTL may comprise AlGaN or InAlGaN. The Al composition in the active region can be less than about 55%. The Al composition in the quantum wells can be chosen such that the light emitted by the active region has a wavelength less than 300 nm.

The aluminum composition of the TEBHTL may decrease as a function of distance from about 100% near the active region to about 55% near the electrical contact layer. The TEBHTL can be doped with a p-type dopant, such as Mg, Be, C, or Zn having a concentration of between about $5\times10^{18}$ cm$^{-3}$ and $5\times10^{21}$ cm$^{-3}$. The injection efficiency of the light emitting diode can be about 50% or even about 95%, for example.

The electrical contact layer can comprise GaN layer that has a thickness less than about 50 nm, less than about 30 nm, or less than about 20 nm, e.g., about 15 nm. The GaN layer is p-doped with a dopant such as Mg, Be, C, or Zn at a concentration of greater than $1\times10^{19}$. In some embodiments, the electrical contact layer is a composite layer comprising at least two materials. One of the materials of the composite electrical contact layer is a metal that is reflective to the emitted light. The composite electrical contact layer can comprise at a metal, a metal alloy, a distributed Bragg reflector, a dielectric, a semiconductor, a dielectric-metal composite, a semiconductor-metal composite, a conductor-metal composite, and an electrical conductor.

In some embodiments, the composite electrical contact layer includes a reflective sub-layer. Materials for a reflective sub-layer can include at least one of Au, Ag, Al, Pd, Ti, and Ni. The reflective sub-layer can be electrically conductive, providing external electrical contact for the LED. Electrically conductive reflective sub-layers may have an electrical resistivity less than about $8\times10^{-4}$ ohm-cm.

In some embodiments, the one or more of the materials of the composite electrical contact layer is patterned to form an array of padlets, e.g., p-GaN padlets, with gaps between the padlets. A reflective material can be disposed in the gaps and over the padlets. In some implementations, a metal is disposed on top of the GaN padlets and the reflector is disposed over the annealed metal and in the gaps. In some embodiments the composite electrical contact includes an unpatterned layer disposed on the TEBHTL. The unpatterned layer may comprise GaN. A metal layer is deposited on the unpatterned layer, annealed, patterned to form an array of metal padlets with gaps between the metal padlets. The reflector is disposed in the gaps and over the metal padlets. In some cases, the reflector is in direct physical contact with the TEBHTL through the gaps. In some configurations, the padlets may have dimensions of about 2 µm×2 µm and the gaps can be less than about 3 µm. In composite electrical contact embodiments that include a patterned layer, the patterning of the layer may remove about 50% of the patterned layer, leaving about 50% of the patterned material on the surface.

In some embodiments, the TEBHTL may include a transparent electrically conductive layer such as ITO with a reflective metal disposed thereon. The transparent electrically conductive layer may function as an optical phase matching layer. The thickness of transparent conductive layer can be adjusted to take advantage of resonance effects in the LED device in order to increase reflectivity.

Some embodiments are directed to a method of forming a light emitting diode subassembly. An active region configured to emit light is deposited on a substrate. A TEBHTL is deposited over the active region. The TEBHTL has a thickness that extends at least a majority of a distance between the active region and an electrical contact layer. The TEBHTL has a band-gap greater than a band-gap of light emitting portions of the active region. The band-gap of the TEBHTL decreases as a function of distance from the active region to the electrical contact layer over a majority of the thickness of the TEBHTL. A composite electrical contact is deposited over the TEBHTL. In certain configurations, depositing the composite electrical contact layer includes depositing a first layer comprising GaN and depositing a second layer comprising ITO. Depositing the ITO includes RF sputtering at ambient pressure of about 5 mTorr with an Ar flow rate of about 100 sccm, an oxygen flow rate of about 6 sccm, and an RF power of about 100 mW. The laser diode subassembly may be annealed at a temperature of about 350 C after depositing the second layer and before depositing a reflector.

In the following detailed description, a number of materials are identified as suitable for various implementations. These materials are to be treated as exemplary, and are not intended to limit the scope of the claims.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

The foregoing description of various embodiments has been presented for the purposes of illustration and description and not limitation. The embodiments disclosed are not intended to be exhaustive or to limit the possible implementations to the embodiments disclosed. Many modifications and variations are possible in light of the above teaching.

The invention claimed is:

1. A light emitting diode, comprising:
   an active region configured to emit light having a wavelength less than 300 nm;
   a composite electrical contact layer comprising at least two materials, at least one of the two materials being a metal configured to reflect a portion of the emitted light and another of the two materials being a III-nitride semiconductor having a thickness less than 20 nm and having a p-type dopant concentration greater than about $1 \times 10^{19}$ cm$^{-3}$; and
   a transparent electron blocking hole transporting layer (TEBHTL) arranged between the composite electrical contact layer and the active region, the TEBHTL doped with a p-type dopant having a concentration between about $5 \times 10^{18}$ cm$^{-3}$ and $5 \times 10^{21}$ cm$^{-3}$ and having a thickness of less than about 50 nm extending at least a majority of a distance between the active region and the composite electrical contact layer, the entire TEBHTL having a band-gap greater than a band-gap of light emitting portions of the active region, the band-gap of the TEBHTL decreasing as a function of distance from the active region to the composite electrical contact layer over a majority of the thickness of the TEBHTL.

2. The light emitting diode of claim 1, wherein the band-gap energy of the TEBHTL decreases linearly, piece-wise linearly, monotonically, or strictly decreases as a function of distance from the active region to the electrical contact layer.

3. The light emitting diode of claim 1, wherein:
   the active region comprises a III-nitride material;
   the TEBHTL comprises a III-nitride material; and
   the composite electrical contact layer comprises a III-nitride material.

4. The light emitting diode of claim 3, wherein an Al composition of the TEBHTL decreases as a function of distance from about 80% to 100% at the active region to about 55% to 70% at the composite electrical contact layer.

5. The light emitting diode of claim 4, wherein an Al composition in a quantum well portion of the active region is less than about 70%.

6. The light emitting diode of claim 4, wherein an Al composition in a quantum well portion of the active region is less than a minimum Al composition in the TEBHTL.

7. The light emitting diode of claim 1, wherein the injection efficiency of the light emitting diode is greater than about 50%.

8. The light emitting diode of claim 1, wherein the composite electrical contact layer comprises first regions of a first material and second regions of the metal, the first and second regions distributed across a surface of the TEBHTL.

9. The light emitting diode of claim 1, wherein:
   the TEBHTL comprises a superlattice having a number of sub-layer pairs, each sub-layer pair having an average bandgap; and
   the average band-gap of the sub-layer pairs decreases as a function of distance from the active region to the composite electrical contact layer over the majority of the thickness of the TEBHTL.

10. A light emitting diode, comprising:
    an active region configured to emit light having a wavelength less than 300 nm;
    a composite electrical contact layer comprising at least two regions, wherein a first of the at least two regions is configured to reflect a portion of the emitted light and a second of the at least two regions is GaN having a thickness less than 20 nm and having a p-type dopant concentration greater than about $1 \times 10^{19}$ cm$^{-3}$; and
    a transparent electron blocking hole transporting layer (TEBHTL) arranged between the composite electrical contact layer and the active region and having a thickness that extends at least a majority of a distance between the active region and the composite electrical contact layer, the TEBHTL doped with a p-type dopant having a concentration between about $5 \times 10^{18}$ cm$^{-3}$ and $5 \times 10^{21}$ cm$^{-3}$, the entire TEBHTL having a band-gap greater than a band-gap of light emitting portions of the active region, the band-gap of the TEBHTL decreasing as a function of distance from the active region to the composite electrical contact layer over a majority of the thickness of the TEBHTL.

11. The light emitting diode of claim 10, wherein the GaN material is a sub-layer of the electrical contact layer.

12. The light emitting diode of claim 10, wherein a thickness of the TEBHTL is less than about 50 nm.

13. The light emitting diode of claim 10, wherein:
    the TEBHTL comprises a superlattice having a number of sub-layer pairs, each sub-layer pair having an average bandgap; and
    the average band-gap of the sub-layer pairs decreases as a function of distance from the active region to the composite electrical contact layer over the majority of the thickness of the TEBHTL.

14. The light emitting diode of claim 10, wherein the reflective composite electrical contact layer comprises a distributed Bragg reflector.

15. The light emitting diode of claim 14, wherein the reflective composite electrical contact layer comprises a dielectric.

* * * * *